United States Patent
Osawa et al.

(10) Patent No.: US 12,481,219 B2
(45) Date of Patent: Nov. 25, 2025

(54) ILLUMINATION OPTICAL SYSTEM, EXPOSURE APPARATUS, IRRADIATION METHOD, AND COMPONENT MANUFACTURING METHOD

(71) Applicant: Ushio Denki Kabushiki Kaisha, Tokyo (JP)

(72) Inventors: Osamu Osawa, Tokyo (JP); Koichi Ito, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 255 days.

(21) Appl. No.: 18/519,917

(22) Filed: Nov. 27, 2023

(65) Prior Publication Data
US 2024/0176246 A1 May 30, 2024

(30) Foreign Application Priority Data
Nov. 28, 2022 (JP) .................. 2022-188946

(51) Int. Cl.
*G03F 7/00* (2006.01)
*G01J 1/42* (2006.01)
*G02B 5/20* (2006.01)

(52) U.S. Cl.
CPC ............ *G03F 7/70066* (2013.01); *G01J 1/42* (2013.01); *G02B 5/20* (2013.01)

(58) Field of Classification Search
CPC .......... G01J 1/42; G02B 5/20; G03F 7/70066; G03F 7/70191; G03F 7/70075; G03F 7/7055; G03F 7/7085
See application file for complete search history.

(56) References Cited

U.S. PATENT DOCUMENTS

| | | | | | |
|---|---|---|---|---|---|
| 4,606,997 | A | * | 8/1986 | Kira ................. | G03F 7/70016 430/394 |
| 2009/0257038 | A1 | * | 10/2009 | Yamamoto ........ | G03F 7/70116 355/70 |
| 2010/0085550 | A1 | * | 4/2010 | Aoki ................. | G03F 7/70241 355/77 |
| 2021/0366702 | A1 | * | 11/2021 | Suzuki ............... | H01J 61/523 |

FOREIGN PATENT DOCUMENTS

| | | | | | |
|---|---|---|---|---|---|
| CN | 106094442 | A | * | 11/2016 | ............. G01B 11/14 |
| JP | H06-061122 | A | | 3/1994 | |
| KR | 100818050 | B1 | * | 3/2008 | .......... G03F 7/7085 |
| KR | 20130053265 | A | * | 5/2013 | ......... G03F 7/70391 |

* cited by examiner

*Primary Examiner* — Peter B Kim
(74) *Attorney, Agent, or Firm* — Studebaker Brackett PLLC

(57) ABSTRACT

An illumination optical system that irradiates a target object with light from a light source unit includes an integrator optical system, a condenser lens, and a bandpass filter. The integrator optical system is disposed on an optical path of the light emitted from the light source unit and uniformizes an illuminance distribution of the light with which the target object is to be irradiated. The condenser lens includes a plurality of lenses and irradiates the target object with the light emitted from the integrator optical system. The bandpass filter is disposed between any two of the plurality of lenses included in the condenser lens.

15 Claims, 6 Drawing Sheets

ILLUMINATION OPTICAL SYSTEM, EXPOSURE APPARATUS, IRRADIATION METHOD, AND COMPONENT MANUFACTURING METHOD

CROSS REFERENCE TO RELATED APPLICATIONS

This application claims the benefit of Japanese Priority Patent Application JP 2022-188946 filed Nov. 28, 2022, the entire contents of which are incorporated herein by reference.

BACKGROUND

The present invention relates to an illumination optical system, an exposure apparatus, an irradiation method, and a component manufacturing method.

SUMMARY

The technology of transferring a pattern formed on a mask (original plate) to a substrate is widely performed using an exposure apparatus (projection aligner).

The exposure apparatus emits light to the mask via an illumination optical system and projects an image of the pattern of the mask onto the substrate via a projection optical system.

If an image-forming optical system including a projection lens is used for the projection optical system, there has been a problem that the resolution of an image projected onto the substrate is reduced due to a wavelength range of an emission line spectrum of a light source and chromatic aberration of the projection lens.

As the technology for solving such a problem, Japanese Patent Application Laid-open No. Hei 06-061122 discloses that a bandpass filter is disposed at a portion adjacent to a light-incident surface of an integrator lens, that is, disposed closer to the light source relative to the integrator lens, to transmit only light having a wavelength whose aberration has been corrected.

Use of the bandpass filter as described above makes it possible to suppress a reduction in resolution of the image projected onto the substrate to some extent.

On the other hand, in recent years, miniaturization of wiring patterns and the like has been increasingly advanced, and further improvement in exposure accuracy has been expected. In other words, there is a demand for a technology for improving resolution of exposure (optical resolution).

In view of the circumstances as described above, it is desirable to provide an illumination optical system, an exposure apparatus, an irradiation method, and a component manufacturing method that are capable of improving resolution of exposure.

According to an embodiment of the present invention, there is provided an illumination optical system that irradiates a target object with light from a light source unit. The illumination optical system includes an integrator optical system, a condenser lens, and a bandpass filter.

The integrator optical system is disposed on an optical path of the light emitted from the light source unit and uniformizes an illuminance distribution of the light with which the target object is to be irradiated.

The condenser lens includes a plurality of lenses and irradiates the target object with the light emitted from the integrator optical system.

The bandpass filter is disposed between any two of the plurality of lenses included in the condenser lens.

In such an illumination optical system, the bandpass filter is disposed between any two of the plurality of lenses constituting the condenser lens. This makes it possible to sufficiently suppress the influence of an incident-angle dependence of light of the bandpass filter. As a result, the filter characteristics of the bandpass filter can be sufficiently exhibited.

Use of the illumination optical system to configure an exposure apparatus makes it possible to improve the resolution of exposure. As a matter of course, the illumination optical system can also be applied to other apparatuses that perform light irradiation.

The illumination optical system may further include a beam splitter and a sensor unit.

The beam splitter is disposed on an optical path from the integrator optical system to the condenser lens and splits the light emitted from the integrator optical system into first split light and second split light, the first split light traveling toward the condenser lens along the optical path, the second split light traveling in a direction deviated from the optical path.

The sensor unit is disposed at a position on which the second split light is to be incident, and detects a state of the light.

The illumination optical system may further include a second bandpass filter that is disposed on a light-incident side of the sensor unit when the bandpass filter is used as a first bandpass filter, the second bandpass filter having a filter characteristic identical to a filter characteristic of the first bandpass filter.

The bandpass filter may have a half bandwidth of 10 nm or less.

An exposure apparatus according to an embodiment of the present invention includes the illumination optical system. The illumination optical system is configured to irradiate an exposure mask with light.

The exposure apparatus may further include a masking blade that is disposed within a range of 15 mm with respect to the exposure mask. The exposure apparatus may be configured such that the light for irradiation is partially blocked by the masking blade.

An exposure apparatus according to another embodiment of the present invention includes the illumination optical system.

The exposure apparatus further includes a masking blade and a masking blade projection optical system that projects the light emitted through an aperture of the masking blade onto an exposure mask. The illumination optical system is configured to irradiate the aperture of the masking blade with the light.

The exposure apparatus may further include a projection optical system that projects a pattern of the exposure mask irradiated with the light onto an exposure target object.

An irradiation method according to another embodiment of the present invention is an irradiation method of irradiating a target object with light, and the irradiation method includes: emitting light from a light source unit; emitting, by an integrator optical system disposed on an optical path of the light emitted from the light source unit, the light toward a condenser lens including a plurality of lenses, in a manner that an illuminance distribution of the light with which the target object is to be irradiated is uniformized; and irradiating, by the condenser lens, the target object with light passing through a bandpass filter disposed between any two of the plurality of lenses.

A component manufacturing method according to another embodiment of the present invention includes performing light irradiation by using an apparatus including the illumination optical system.

The apparatus including the illumination optical system may be an exposure apparatus. In this case, the performing light irradiation may include projecting a pattern of an exposure mask. Note that the apparatus including the illumination optical system may be another exposure apparatus that does not include the illumination optical system or another exposure apparatus that performs light irradiation.

As described above, according to the present invention, it is possible to improve resolution of exposure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments according to the present invention will be described with reference to the drawings.

[Basic Configuration of Exposure Apparatus]

Figure 1:
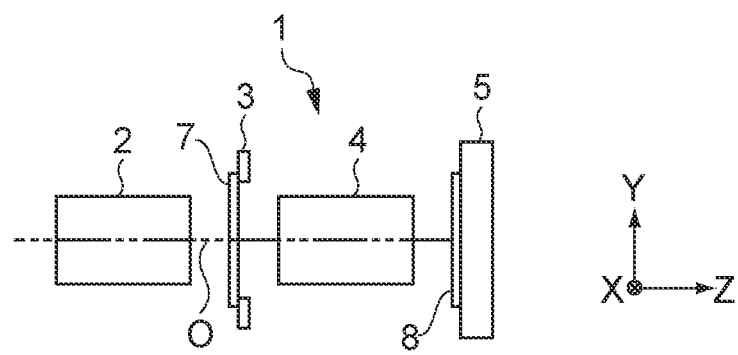
FIG. 1 is a schematic diagram showing a configuration example of an exposure apparatus according to an embodiment of the present invention.

FIG. 1 is a schematic diagram showing a configuration example of an exposure apparatus according to an embodiment of the present invention.

The exposure apparatus 1 includes an illumination optical system 2, a mask stage 3, a projection optical system 4, and a workpiece stage 5.

The illumination optical system 2, the mask stage 3, the projection optical system 4, and the workpiece stage 5 are disposed in the stated order along a direction of an optical axis O of the illumination optical system 2.

Hereinafter, as shown in FIG. 1, the direction of the optical axis O of the illumination optical system 2 will be referred to as a Z direction. Further, a direction orthogonal to the Z direction and extending in a depth direction of the figure will be referred to as an X direction. Further, a direction orthogonal to the Z direction and the X direction and extending vertically in the figure will be referred to as a Y direction.

The mask stage 3 holds an exposure mask (hereinafter, simply referred to as mask) 7. In this embodiment, the mask 7 is disposed so as to be orthogonal to the optical axis O of the illumination optical system 2. A predetermined pattern is formed on the mask 7.

The specific configuration of the mask 7 is not limited. Further, the specific configuration of the mask stage 3 is also not limited, and any configuration may be employed.

The workpiece stage 5 holds a substrate 8 as a workpiece. In this embodiment, the substrate 8 is disposed so as to be orthogonal to the optical axis O of the illumination optical system 2. Further, the substrate 8 is disposed at a position optically conjugate with the mask 7.

Typically, the workpiece stage 5 is configured to be movable. For example, when the workpiece stage 5 is driven, a region to be exposed on the substrate 8 is moved and then exposed (sequentially exposed) in a step-and-repeat method. Further, when the workpiece stage 5 is retracted from the exposure region, the substrate 8 to be exposed is replaced.

The illumination optical system 2 irradiates the mask 7 held by the mask stage 3 with light.

The illumination optical system 2 is configured as one embodiment of an illumination optical system according to the present invention.

The specific configuration of the illumination optical system 2 will be described later.

The projection optical system 4 projects an image of a pattern formed on the mask 7 onto the substrate 8 disposed on the workpiece stage 5. In other words, the projection optical system 4 projects the pattern of the mask 7 that has been irradiated with light onto the substrate 8.

The projection optical system 4 is configured as an image-forming optical system including a projection lens. The specific configuration of the projection optical system 4 is not limited, and any configuration may be employed.

Figure 2:
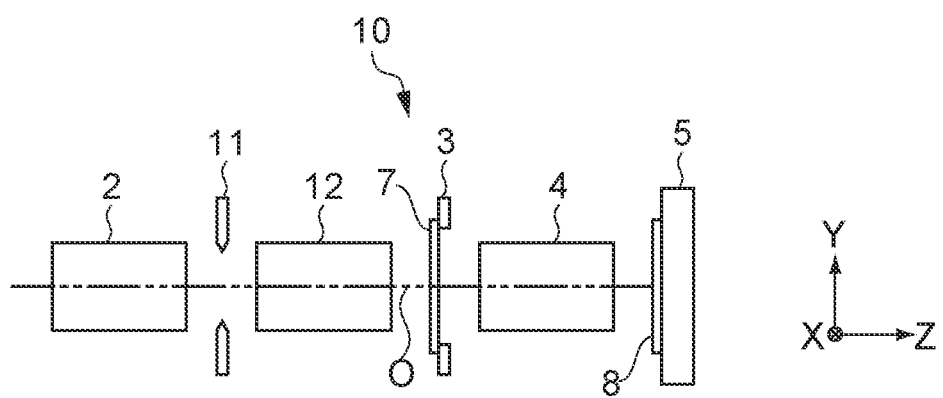
FIG. 2 is a schematic diagram showing a configuration example of an exposure apparatus according to another embodiment of the present invention.

FIG. 2 is a schematic diagram showing a configuration example of an exposure apparatus according to another embodiment of the present invention.

In an exposure apparatus 10 shown in FIG. 2, a masking blade 11 and a masking blade projection optical system 12 are disposed between an illumination optical system 2 and a mask stage 3 (mask 7). The masking blade 11 and the masking blade projection optical system 12 are disposed in the stated order along a direction of an optical axis O of the illumination optical system 2.

The masking blade 11 is configured as a light shielding member capable of freely controlling the size of an aperture. As shown in FIG. 2, the illumination optical system 2 irradiates the aperture of the masking blade 11 with light. The masking blade projection optical system 12 irradiates the mask 7 with the light emitted from the masking blade 11 and projects the aperture of the masking blade 11 onto the mask 7.

For example, controlling the masking blade 11 makes it possible to form an image of the masking blade 11 onto a region, which is desired to be shielded from light, of the mask 7. Therefore, controlling the masking blade 11 makes it possible to control the size, shape, position, and the like of the region irradiated with the light with which the mask 7 is to be irradiated.

Further, for example, if a plurality of patterns are formed on the mask 7, controlling the masking blade 11 makes it possible to irradiate only a necessary pattern with light and to expose the substrate 8 using only that pattern.

The specific configurations of the masking blade 11 and the masking blade projection optical system 12 are not limited, and any configuration may be employed.

The exposure apparatuses 1 and 10 shown in FIGS. 1 and 2 each correspond to one embodiment of an apparatus including the illumination optical system according to the present invention. Further, the substrate 8 corresponds to one embodiment of an exposure target object.

In the exposure apparatus 1 shown in FIG. 1, the mask stage 3 functions as a mask holding unit that holds an exposure mask.

The illumination optical system 2 functions as an illumination optical system that irradiates the exposure mask with light.

In the exposure apparatus 10 shown in FIG. 2, the mask stage 3 functions as a mask holding unit that holds an exposure mask.

In the exposure apparatus 10 shown in FIG. 2, the illumination optical system 2 configured as one embodiment of the illumination optical system of the present invention irradiates the aperture of the masking blade 11 with light.

Further, the masking blade projection optical system 12 functions as an optical system that projects the light emitted through the aperture of the masking blade 11 onto the exposure mask. In other words, the masking blade projection optical system 12 projects an image of the aperture of the masking blade 11 onto the mask 7.

[Configuration of Illumination Optical System 2]

First and second embodiments will be described as configuration examples of the illumination optical system 2 shown in FIGS. 1 and 2.

First Embodiment

Figure 3:
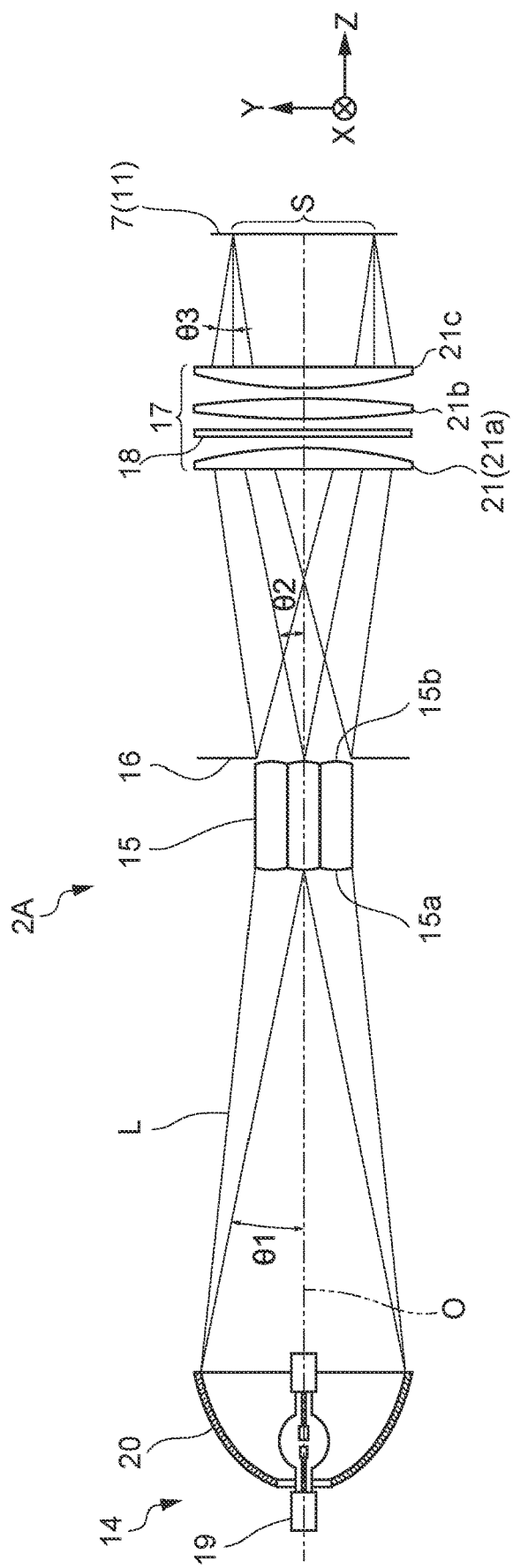
FIG. 3 is a schematic diagram showing a configuration example of an illumination optical system according to a first embodiment.

FIG. 3 is a schematic diagram showing a configuration example of an illumination optical system 2A according to a first embodiment.

The illumination optical system 2A includes a light source unit 14, an integrator lens 15, an aperture (aperture stop) 16, a condenser lens 17, and a bandpass filter 18.

The light source unit 14, the integrator lens 15, the aperture 16, the condenser lens 17, and the bandpass filter 18 are configured with an optical axis O as a reference.

The illumination optical system 2A allows a target object to be irradiated with light (light beam) L from the light source unit 14. If the exposure apparatus 1 shown in FIG. 1 is configured, the target object is the mask 7. If the exposure apparatus 10 shown in FIG. 2 is configured, the target object is the masking blade 11.

Hereinafter, the case where the target object is the mask 7 will be described as an example.

The light source unit 14 includes a lamp 19 and a condensing mirror 20.

In this embodiment, a short-arc mercury lamp is used as the lamp 19. For example, light in wavelengths of 365 nm (i-line), 405 nm (h-line), 436 nm (g-line), and the like as emission lines is emitted from the lamp 19.

The condensing mirror 20 condenses the light L emitted from the lamp 19 and emits the condensed light along the optical axis O.

In this embodiment, a reflection surface of the condensing mirror 20 includes a part of a spheroidal surface with the optical axis O as a center axis. Further, in this embodiment, the condensing mirror 20 is disposed such that one focal point (first focal point) of the condensing mirror 20 is located on the optical axis O. A light emitting point of the lamp 19 is then disposed in the vicinity of the first focal point of the condensing mirror 20. Therefore, the lamp 19 is disposed such that the light emitting point is located on the optical axis O.

Regarding the application of the present invention, the configuration of the light source unit 14 is not limited, and a light source other than the mercury lamp may be used. For example, a light source that emits light of a different wavelength band may be used, or a solid-state light source such as a light emitting diode (LED) may be used.

The integrator lens 15 is disposed on the optical path of the light L emitted from the light source unit 14 and uniformizes the illuminance distribution of the light L with which the mask 7 is to be irradiated. The integrator lens 15 includes a plurality of lens segments (a plurality of fine lenses) arranged in a matrix and is also referred to as a fly-eye lens. The lens segment can also be referred to as a wavefront splitting element.

The region irradiated with the light, which is emitted from the light source unit 14 and with which the mask 7 is to be irradiated, has a similar shape to the lens segment constituting the integrator lens 15. The integrator lens 15 is disposed such that a light-incident surface 15a is located at another focal point (second focal point) of the condensing mirror 20 or in the vicinity thereof.

As shown in FIG. 3, the light L is emitted as divergent light from each lens segment of the integrator lens 15. In other words, the light L is emitted as divergent light from the integrator lens 15.

The integrator lens 15 functions as an embodiment of an integrator optical system of the present invention. The specific configuration of the integrator lens 15 is not limited, and any configuration may be employed.

Further, as one embodiment of the integrator optical system according to the present invention, an optical component other than an integrator lens including a plurality of lens elements may be used. For example, an optical rod or the like may be used as the integrator optical system.

The aperture 16 is disposed on the light-emission side of the integrator lens 15. Specifically, the aperture 16 is disposed in the vicinity of a light-emission surface 15b of the integrator lens 15.

Appropriately controlling the size of the aperture 16 (aperture size) makes it possible to control a visual angle (also referred to as collimation half-angle) of the light L with which the mask 7 is to be irradiated. In other words, the aperture 16 can shape the light flux.

Typically, the shape of the aperture 16 (aperture shape) as viewed in the optical axis direction (in the extending direction of the optical axis O) is circular. As a matter of course, the present invention is not limited to the above shape, and an elliptical or rectangular aperture may be formed.

The condenser lens 17 includes a plurality of lenses 21 and irradiates the mask 7 with the light L, which has been emitted from the integrator lens 15 and has passed through the aperture 16. In this embodiment, three lenses 21a to 21c constitute the condenser lens 17. Further, the condenser lens 17 is configured to have a positive refractive power (optical power) as a whole.

As shown in FIG. 3, the light L is emitted as divergent light from the integrator lens 15 via the aperture 16. The light L is refracted by the positive refractive power of the condenser lens 17 including the three lenses 21a to 21c to be used to irradiate the mask 7.

In each of the three lenses 21a to 21c, the shape of the light-incident surface and the light-emission surface, the refractive power, and the like are not limited and may be appropriately designed. For example, the following configuration may be employed, in which after a light flux is expanded by the lens having a negative refractive power, the light flux is then condensed by a lens having a positive refractive power. Further, the number of lenses 21 constituting the condenser lens 17 is not limited, and any number of lenses may be used.

In addition to the above, the material and the like of each lens 21 are not limited and may be discretionally designed.

The bandpass filter 18 is disposed between any two of the plurality of lenses 21 constituting the condenser lens 17. In this embodiment, the bandpass filter 18 is disposed between the lens 21a and the lens 21b.

The bandpass filter 18 transmits light in a predetermined wavelength band and blocks light in the other wavelength bands. In other words, the bandpass filter 18 can limit the wavelength band of incident light.

Figure 4:
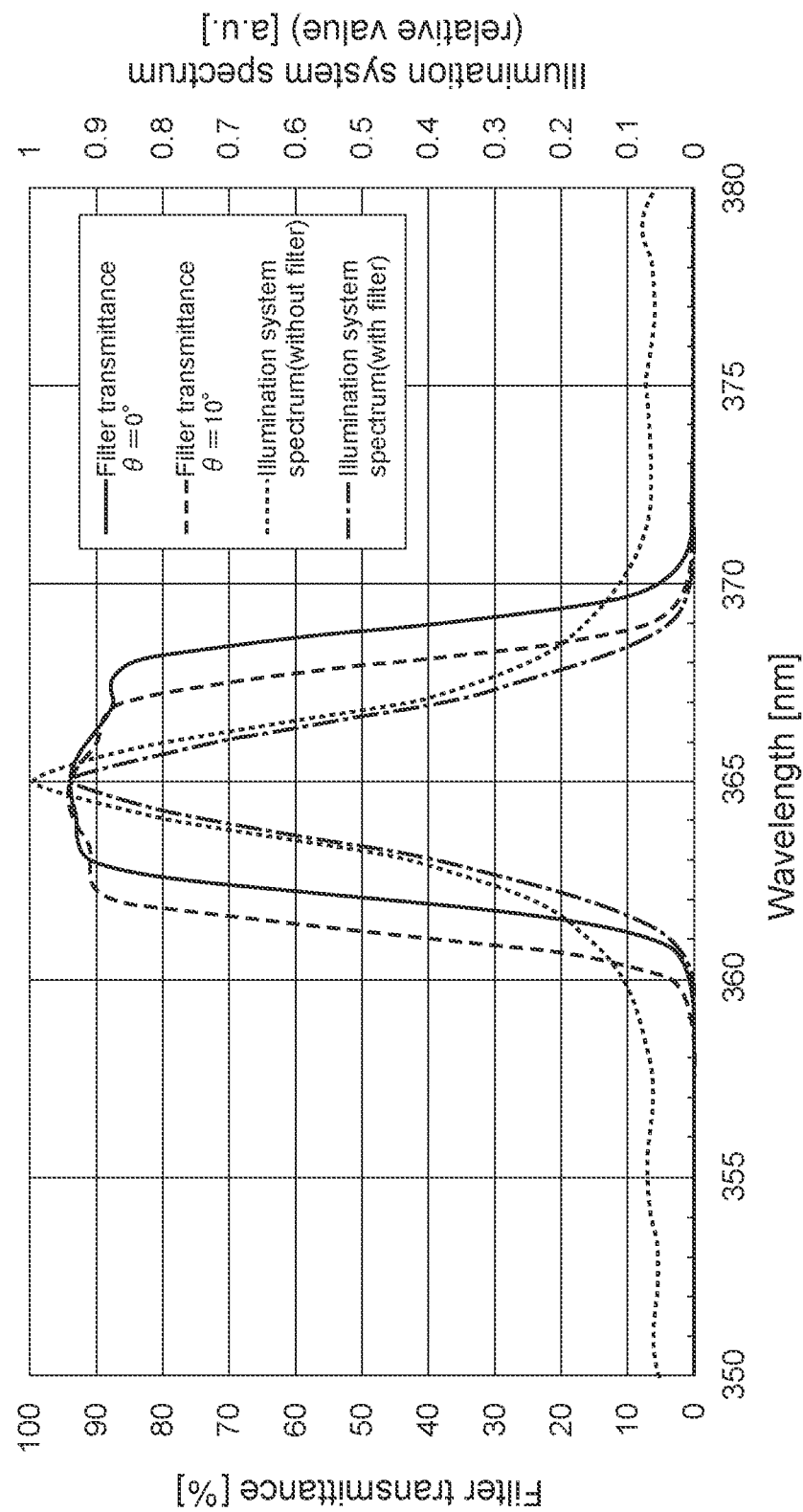
FIG. 4 is a graph showing filter characteristics (transmittance characteristics) of a bandpass filter and examples of a spectrum of light emitted from the illumination optical system.

FIG. 4 is a graph showing filter characteristics (transmittance characteristics) of the bandpass filter 18 and examples of a spectrum of the light L emitted from the illumination optical system 2A.

The "filter transmittance" in the figure corresponds to the transmittance characteristics of the bandpass filter 18. The "illumination system spectrum" in the figure corresponds to the spectrum of the light L emitted from the illumination optical system 2A. Further, the graph shown in FIG. 4 is a graph created on the basis of actual measurement results.

As shown in FIG. 4, in this embodiment, the bandpass filter 18 is designed such that the wavelength 365 nm (i-line), which is an emission line of the lamp 19, is the center wavelength of the transmission band. Further, the bandpass filter 18 is configured as a narrow bandpass filter having a half bandwidth of 10 nm or less.

In this embodiment, for example, the bandpass filter 18 having filter characteristics of a half bandwidth of approximately 7 nm is used.

[Studies for Improving Resolution of Exposure]

In order to improve the resolution of exposure, the inventors of the present invention have repeatedly studied the reduction in influence of chromatic aberration of the projection lens included in the projection optical system 4 shown in FIG. 1. Use of the narrow bandpass filter 18 to limit the wavelength band of the light L used for exposure makes it possible to reduce the influence of chromatic aberration. On the other hand, if the transmission band of the narrow bandpass filter 18 is extremely narrow, light in the wavelength band necessary for exposure is not obtained, and the amount of light is insufficient.

As a result of the studies in consideration of the above point, first, it has been found that use of the narrow bandpass filter having a half bandwidth of 10 nm or less allows appropriate exposure to be performed while sufficiently reducing the influence of chromatic aberration of the projection lens. For example, it has been found that use of a bandpass filter having a half bandwidth in the range, for example, from 6 nm to 10 nm can provide a highly effective result.

Furthermore, the inventors of the present invention have repeatedly studied the improvement in resolution of exposure.

FIG. 4 illustrates transmittance characteristics obtained when ultraviolet rays in the bandwidth from a wavelength of 350 nm to a wavelength of 380 nm with a wavelength of 365 nm (i-line) as a peak wavelength are incident at an incident angle θ=0°. Further, FIG. 4 illustrates transmittance characteristics obtained when ultraviolet rays in the bandwidth from a wavelength of 350 nm to a wavelength of 380 nm with a wavelength of 365 nm (i-line) as a peak wavelength are incident at an incident angle θ=10°.

When the transmittance characteristics at the incident angle θ=0° is compared with the transmittance characteristics at the incident angle θ=10°, it is found that as the incident angle θ of the light beam incident on the bandpass filter 18 becomes larger, the transmittance characteristics are shifted to have a shorter wavelength.

In such a manner, the bandpass filter 18 has an incident-angle dependence, which indicates that the characteristics of the bandpass filter 18 depend on the incident angle of an incident light beam. For example, if the transmittance characteristics are greatly shifted to have a shorter wavelength, the following cases may occur: light having a necessary wavelength may be partially cut and the amount of light (light intensity) may be reduced; or light deviated from a designed wavelength (exposure wavelength) may leak to be used for exposure. Such a phenomenon leads to a reduction in resolution of exposure.

If the narrow bandpass filter 18 having a half bandwidth of 10 nm or less is used so as to reduce the influence of chromatic aberration, it is important to minimize the amount of shift of the transmittance characteristics due to the incident-angle dependence as much as possible.

The inventors of the present invention have focused on the incident angle distribution of light beams incident on the bandpass filter 18, and have newly devised that the bandpass filter 18 is disposed at a position at which the range of the incident angle (variation of incident angle) is reduced in the illumination optical system 2. Arranging the bandpass filter 18 at a position at which the range of the incident angle (variation of incident angle) is reduced makes it possible to minimize the shift of the transmittance characteristics as much as possible, and to improve resolution of exposure.

Note that FIG. 4 illustrates a spectrum of the light L emitted from the illumination optical system 2A (without filter) when the bandpass filter 18 is not disposed. Further, FIG. 4 illustrates a spectrum of the light L emitted from the illumination optical system 2A (with filter) when the bandpass filter 18 is disposed.

Setting the incident angle range of the light beams incident on the bandpass filter 18 to be small makes it possible to use the light L in a desired wavelength band for exposure and to improve the resolution of exposure.

Figure 5:
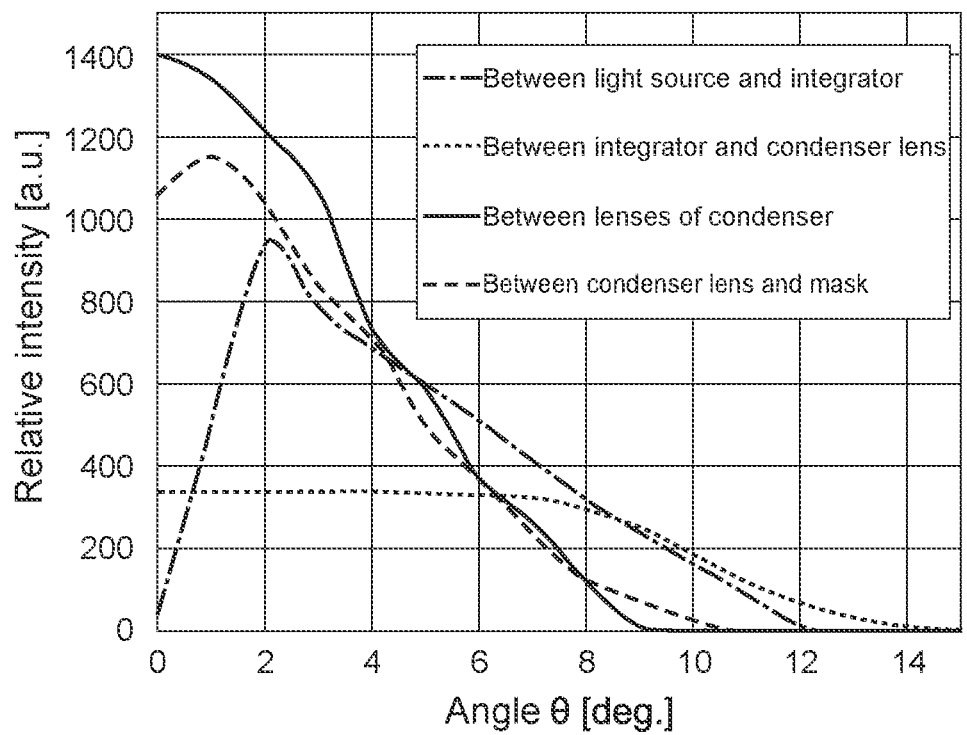
FIG. 5 is a graph showing simulation results of an incident angle distribution of light on a filter surface when the bandpass filter is disposed at each position in the illumination optical system.

FIG. 5 is a graph showing simulation results of the incident angle distribution of the light L when the bandpass filter 18 is disposed at each position in the illumination optical system 2A. In this simulation, assuming the incident angle of the light L incident along the direction of the optical axis O (Z direction) as 0°, the incident angle distribution is calculated.

An angle θ1 shown in FIG. 3 is a maximum incident angle of the light L that is incident on the center, i.e., a position on the optical axis O, of the light-incident surface 15a of the integrator lens 15. The graph indicated as "between the light source and the integrator" in FIG. 5 is a simulation result of the incident angle distribution of the light L that is incident on the bandpass filter 18 when the bandpass filter 18 is disposed between the light source unit 14 and the integrator lens 15.

In this example, in the incident angle distribution of the light L that is incident on the bandpass filter 18, the maximum incident angle, that is, the angle at which the relative intensity decreases to zero has a slightly larger value, but is close to, the angle θ1 shown in FIG. 3.

An angle θ2 shown in FIG. 3 is a maximum emission angle of the light L emitted from the center, i.e., a position on the optical axis O, of the light-emission surface 15b of the integrator lens 15. In this embodiment, the light L emitted from the center of the light-emission surface 15b of the integrator lens 15 can also be light L emitted from the center of the aperture 16.

The graph indicated as "between the integrator and the condenser lens" in FIG. 5 is a simulation result of the emission angle distribution of all the light L that comes from the entire light-emission surface 15b of the integrator lens 15 and further passes through the aperture 16. This graph is a simulation result of the incident angle distribution of the light L that is incident on the bandpass filter 18 when the bandpass filter 18 is disposed between the integrator lens 15 (aperture 16) and the condenser lens 17.

In this example, in the incident angle distribution of the light L that is incident on the bandpass filter 18, the maximum incident angle is larger than the angle θ2 shown in FIG. 3.

The graph indicated as "between the lenses of the condenser" in FIG. 5 is a simulation result of the incident angle distribution of the light L that is incident on the bandpass filter 18 disposed at the position shown in FIG. 3. In other words, the graph is a simulation result of the incident angle distribution of the light L when the bandpass filter 18 is disposed between the lens 21a and the lens 21b of the condenser lens 17.

An angle θ3 shown in FIG. 3 is a maximum incident angle of the light L incident on an edge of an irradiation region S on the mask 7. The graph indicated as "between the condenser lens and the mask" in FIG. 5 is a simulation result of the incident angle distribution of the light L that is incident on the bandpass filter 18 when the bandpass filter 18 is disposed between the condenser lens 17 and the mask 7.

In this example, in the incident angle distribution of the light L that is incident on the bandpass filter 18, the maximum incident angle has a value close to the angle θ3 shown in FIG. 3.

As shown in FIG. 5, if the bandpass filter 18 is disposed between the lens 21a and the lens 21b of the condenser lens 17, the range of the incident angle distribution is from 0 to 9°, which is smallest. Therefore, as shown in FIG. 3, if the bandpass filter 18 is disposed between the lens 21a and the lens 21b of the condenser lens 17, the shift of the transmittance characteristics due to the incident-angle dependence can be sufficiently suppressed.

As a result, it is possible to sufficiently reduce the chromatic aberration of the projection lens, perform exposure by the light L in a desired wavelength band, and sufficiently improve the resolution of exposure.

As shown in FIG. 3, the divergent light is emitted from each lens segment of the integrator lens 15 and enters the condenser lens 17 through the aperture 16. Therefore, as the light L that has been emitted from the integrator lens 15 and has passed through the aperture 16 moves away from the aperture 16, the size of the light flux increases when viewed along the optical axis O. In other words, when the light L is viewed along the optical axis O, the distance from the outermost edge of the light flux to the optical axis O increases.

In such a manner, the positive refractive power acts on the expanding light flux by the condenser lens 17, and the light flux is superimposed on the irradiation region S on the mask 7. Therefore, the range of the incident angle distributions "between the lenses of the condenser" and "between the condenser lens and the mask" shown in FIG. 5 is smaller than the range of the incident angle distributions "between the light source and the integrator" and "between the integrator and the condenser lens".

Further, if the lens characteristics and the like of the plurality of lenses 21 constituting the condenser lens 17 are appropriately designed, the range of the incident angle distribution "between the lenses of the condenser" can be relatively easily reduced. As a matter of course, the lenses 21 between which the bandpass filter 18 is disposed only need to be disposed at positions where the range of the incident angle distribution is the smallest.

In other words, arranging the bandpass filter 18 at a position sandwiched between the lenses 21 in the condenser lens 17 including the plurality of lenses 21 is significantly advantageous to reduce the incident angle range of the light beams incident on the bandpass filter 18.

As a result, it is possible to sufficiently reduce the chromatic aberration of the projection lens, perform exposure by the light L in a desired wavelength band, and improve the resolution of exposure.

[Irradiation Method]

An irradiation method of irradiating the mask 7 (masking blade 11) with the light L by the illumination optical system 2A according to this embodiment will be described with reference to FIG. 3.

The light L is emitted from the light source unit 14.

The light L is emitted toward the condenser lens 17 including the plurality of lenses 21 through the aperture 16 such that the illuminance distribution of the light L, with which the mask 7 (masking blade 11) is to be irradiated, is uniformized by the integrator lens 15 disposed on the optical path of the light L emitted from the light source unit 14.

The condenser lens 17 irradiates the mask 7 (masking blade 11) with the light L that has passed through the bandpass filter 18 disposed between any two of the plurality of lenses 21.

This irradiation method makes it possible to sufficiently reduce the chromatic aberration of the projection lens, perform exposure by the light L in a desired wavelength band, and sufficiently improve the resolution of exposure.

As described above, in the illumination optical system 2A according to this embodiment, the bandpass filter 18 is disposed between any two of the plurality of lenses 21 constituting the condenser lens 17. This makes it possible to sufficiently suppress the influence of the incident-angle dependence of the light L of the bandpass filter 18. As a result, the filter characteristics of the bandpass filter 18 can be sufficiently exhibited.

The exposure apparatuses 1 and 10 are each configured using the illumination optical system 2A, so that the resolution of exposure can be improved. As a matter of course, the illumination optical system 2A can also be applied to other apparatuses for light irradiation.

Second Embodiment

An illumination optical system according to a second embodiment of the present invention will be described. Hereinafter, description of the configurations and effects similar to those of the illumination optical system 2A described in the above embodiment will be omitted or simplified.

Figure 6:
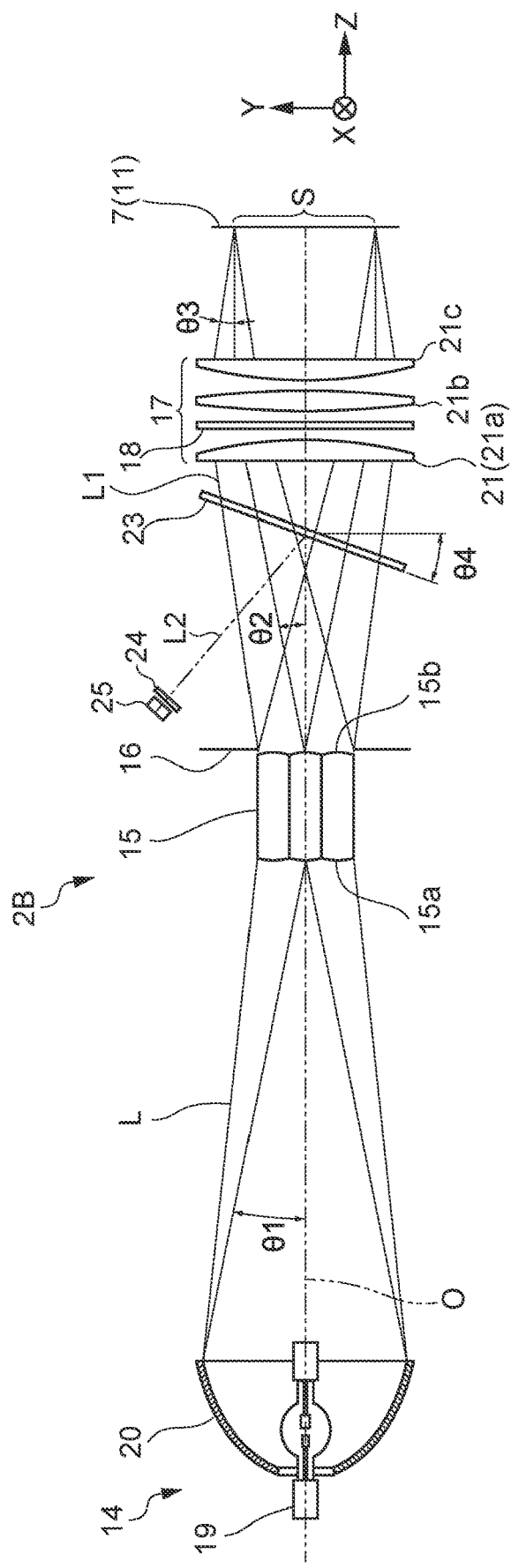
FIG. 6 is a schematic diagram showing a configuration example of an illumination optical system according to a second embodiment.

FIG. 6 is a schematic diagram showing a configuration example of an illumination optical system 2B according to the second embodiment.

The illumination optical system 2B further includes a beam splitter 23, a bandpass filter 24, and a sensor unit 25.

The beam splitter 23 is disposed on the optical path from the integrator lens 15 to the condenser lens 17 and splits the light L, which has been emitted from the integrator lens 15 and has passed through the aperture 16, into first split light L1 traveling toward the condenser lens 17 along the optical path and second split light L2 traveling in a direction deviated from the optical path.

In this embodiment, the condenser lens 17 is irradiated with the light transmitted through the beam splitter 23 as the first split light L1. The first split light L1 is transmitted through the condenser lens 17 in which the bandpass filter 18 is disposed, and the mask 7 is then irradiated with the first split light L1. In other words, the first split light L1 is light used for exposure.

Meanwhile, the light reflected by the beam splitter 23 travels, as the second split light L2, in a direction deviated from the optical path. Therefore, the second split light L2 is not used for exposure.

Note that FIG. 6 schematically illustrates the optical axis of the second split light L2 reflected by the beam splitter 23. The illustration of the light beam itself of the second split light L2 is omitted. The optical axis of the second split light L2 is denoted by L2.

The beam splitter 23 is configured such that the amount of light of the first split light L1 used for exposure is larger than the amount of light of the second split light L2. In other words, in this embodiment, the beam splitter 23 is configured to have characteristics of high transmittance and low reflectance.

For example, a beam splitter 23 having characteristics of very high transmittance, such as having 92% to 99% of transmittance and 1% to 8% of reflectance, is used.

For example, one or both surfaces of a transparent substrate are appropriately coated with a single-layer film or multi-layer film made of dielectrics or the like, so that a beam splitter 23 having characteristics of high transmittance and low reflectance can be created.

To achieve characteristics of high transmittance and low reflectance, for example, the surface may be coated with an antireflection coating that can suppress the reflectance to approximately 2%. In addition to the above, the specific configuration of the beam splitter 23 is not limited, and any configuration may be employed.

The sensor unit 25 is a photoreceiver of an illuminance monitor, and is disposed at a position on which the second split light L2 is incident. The specific configuration of the sensor unit 25 is not limited, and any configuration may be employed.

The bandpass filter 24 is disposed on a light-incident side of the sensor unit 25. Further, the bandpass filter 24 is configured to have the same filter characteristics as those of the bandpass filter 18. In other words, in this embodiment, a narrow bandpass filter having filter characteristics (transmittance characteristics) shown in FIG. 4 and having a half bandwidth of 10 nm or less is used as the bandpass filter 24.

Arranging the bandpass filter 24 makes it possible to highly accurately monitor the illuminance of the first split light L1 that passes through the bandpass filter 18 to be used to irradiate the mask 7.

In the configuration shown in FIG. 6, the bandpass filter 18 corresponds to one embodiment of the first bandpass filter. The bandpass filter 24 corresponds to one embodiment of the second bandpass filter.

The sensor unit 25 functions as the illuminance monitor. The detected light is corrected so as to represent the illuminance of the exposure surface, and is used for integrated exposure control in the exposure. In other words, the opening time of the shutter, which is not illustrated in FIG. 6, is controlled such that the exposure is performed with the set amount of light. Further, the lighting power that is input to the lamp 19 is controlled in accordance with an illuminance value of the detected light, and thus a decrease in illuminance due to aging deterioration or the like of the lamp 19 is suppressed. For example, in the normal use of the exposure apparatus, the exposure is started in a state in which the lighting power to the lamp 19 is suppressed to some extent. If the illuminance of the lamp 19 is decreased due to aging deterioration or the like, the lighting power is increased to keep the illuminance of the exposure surface constant.

If such a control method is executed, the spectrum of the light L emitted from the lamp 19 changes due to the change in the lighting power to the lamp 19.

Problems in the absence of the bandpass filter 24 and the reason for the need of the bandpass filter 24 will be described.

If the narrow bandpass filter 18 having a half bandwidth of 10 nm or less as shown in FIG. 4 is used, the spectrum of the light L emitted from the lamp 19 is changed due to the lighting power. Hence, the relationship between the illuminance of the light L transmitted through the bandpass filter 18 on the exposure surface and the illuminance detected by the illuminance monitor 25 without passing through the bandpass filter 24 is not proportional. In this case, even if the lighting power is controlled so as to increase the illuminance by 10% on the basis of the detected illuminance of the illuminance monitor, the illuminance on the exposure surface does not reach the illuminance increased by 10%, and a difference occurs. This is because the spectrum of the light on the exposure surface is different from the spectrum of the light detected by the illuminance monitor 25.

Therefore, in the illumination optical system 2B shown in FIG. 6, the bandpass filter 24 having the same filter characteristics as those of the bandpass filter 18 is disposed on the light-incident side of the sensor unit 25. Hence, if the spectrum of the light L emitted from the lamp 19 is changed due to the control of the lighting power or the like, it is possible to highly accurately monitor the illuminance of the first split light L1, which is to be transmitted through the bandpass filter 18 and with which the mask 7 is to be irradiated.

An angle θ4 shown in FIG. 6 is an inclination angle of the reflection surface of the beam splitter 23 facing the optical axis O with respect to the plane perpendicular to the optical axis O. In this embodiment, a value in the range from 10° to 30° is used as the inclination angle θ4. This allows the second split light L2 to be properly guided to the sensor unit 25. Further, this makes it possible to sufficiently suppress an increase in the size of the apparatus due to arrangement of the sensor unit 25. As a matter of course, the angle at which the beam splitter 23 is disposed is not limited.

Figure 7:
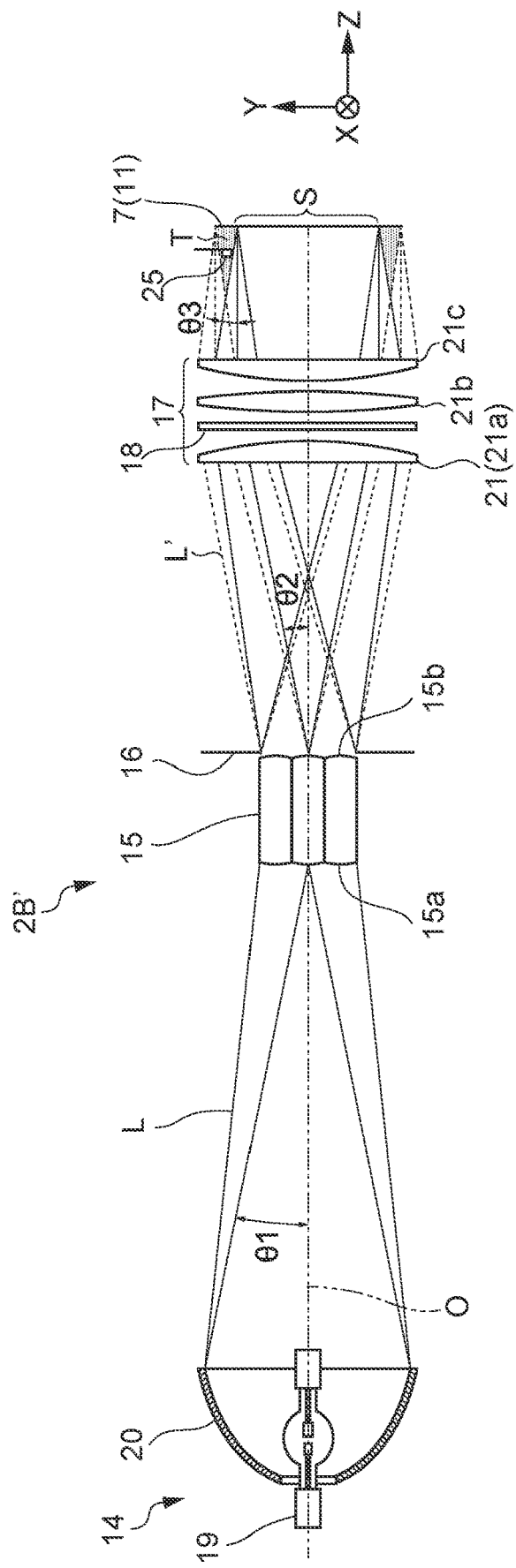
FIG. 7 is a schematic diagram for describing another position at which a sensor unit is disposed.

FIG. 7 is a schematic diagram for describing another position at which the sensor unit 25 is disposed.

In an illumination optical system 2B' shown in FIG. 7, the sensor unit 25 is disposed at the subsequent stage of the bandpass filter 18. This makes it possible to highly accurately detect the illuminance of the light L with which the mask 7 or the exposure surface is irradiated.

For example, among the light beams emitted from the respective lens segments of the integrator lens 15, light L' on the outer side of the light L superimposed on the irradiation region S of the mask 7 can be monitored.

In the example shown in FIG. 7, the light L' emitted further on the outer side of the light fluxes, which are emitted from the respective lens segments and with which the irradiation region S is to be irradiated, is monitored. The light L' is emitted to the vicinity of the outer side of the irradiation region S on the mask 7. In other words, assuming that the irradiation region S is an effective range, the light L' is the light emitted to the outside of the effective range.

In the example shown in FIG. 7, the sensor unit 25 is disposed in a region T in which the light L' can be stably received. The region T is located between the condenser lens 17 and the mask 7 and located at a position where the light L emitted to the irradiation region S is not blocked.

The resolution of exposure (optical resolution) is generally proportional to the wavelength of the light source (light for exposure) and inversely proportional to a numerical aperture NA of the illumination optical system 2. Therefore, as the numerical aperture NA increases, the resolution increases.

In the example shown in FIG. 7, if the numerical aperture NA of the illumination optical system 2B' is increased so as to increase the resolution, the region T in which the sensor unit 25 can be disposed is narrowed between the condenser lens 17 and the mask 7, and may be located in the vicinity of the mask 7 (masking blade 11).

A drive mechanism of the mask 7 (masking blade 11) is provided in the vicinity of the mask 7 (masking blade 11), and thus the sensor unit 25 is less likely to be disposed there. The sensor unit 25 needs to be disposed close to the lens 21C of the condenser lens 17.

As shown in FIG. 7, the region T becomes narrower as the region T comes closer to the lens 21C. For that reason, in order to arrange the sensor unit 25, the region T needs to be widened by emitting the light L' to a wider range outside the irradiation region S (effective range), and the irradiance will decrease accordingly. Further, as the numerical aperture NA becomes larger, the region T becomes narrower, and the irradiation range needs to be widened accordingly. This also decreases the irradiance.

The region T is a region in which stable irradiation is necessary for the sensor unit 25 in a similar manner to the effective range S, and ensuring the region T is equivalent to widening the effective range S including the region T, and thus the light utilization efficiency will be greatly reduced.

Therefore, if the light L is monitored by using the sensor unit 25, the configuration shown in FIG. 6 is more advantageous than the configuration shown in FIG. 7.

Note that the illumination optical system 2A according to the first embodiment shown in FIG. 3, and the illumination optical systems 2B and 2B' according to the second embodiment shown in FIGS. 6 and 7 may have a configuration in which the aperture 16 is not disposed.

For example, if projection exposure is performed using the projection optical system 4 as shown in FIGS. 1 and 2, the aperture 16 is used. On the other hand, for example, if projection exposure is not performed, the aperture 16 is not used in some cases.

Further, even if the projection exposure is performed, the aperture 16 can be omitted as long as the lens segments of the integrator lens 15 can be finely configured and arranged in the same shape as the aperture 16.

Even in the configuration in which the aperture 16 is not used, the same effects as those described above can be exhibited, and the resolution of exposure can be improved.

[Component Manufacturing Method]

As a component manufacturing method according to the present invention, for example, any method including the light irradiation step can be performed using apparatuses including the illumination optical systems 2A, 2B, and 2B' according to the first and second embodiments.

For example, the exposure apparatuses 1 and 10 shown in FIGS. 1 and 2 are configured as apparatuses including the illumination optical systems 2A, 2B, and 2B' shown in FIGS. 3, 6, and 7. As the light irradiation step, a pattern of the exposure mask is projected, so that a component is manufactured.

Use of the exposure apparatuses 1 and 10 to perform exposure makes it possible to manufacture various substrates, on which a predetermined pattern is formed, as components. For example, an electric circuit element, an optical element, a micro electro mechanical systems (MEMS), a recording element, a sensor, a mold, or the like can be manufactured as a component.

Examples of the electric circuit element include volatile or non-volatile semiconductor memories such as a dynamic random access memory (DRAM), a static random access memory (SRAM), a flash memory, and an magnetoresistive random access memory (MRAM), and semiconductor elements such as an large scale integration (LSI), a charge coupled device (CCD), an image sensor, and a field-programmable gate array (FPGA). Examples of the mold include a mold for imprinting.

The present invention is not limited to the exposure apparatus, and various other apparatuses may be configured as the apparatus including the illumination optical systems 2A, 2B, and 2B'. A manufacturing method for manufacturing various components, which includes a light irradiation step, may be performed by the apparatus.

Other Embodiments

The present invention is not limited to the embodiments described above, and various other embodiments can be implemented.

If the masking blade 11 is used as in the case of the exposure apparatus 10 shown in FIG. 2, the masking blade 11 can also be disposed in the immediate vicinity of the mask 7 without using the masking blade projection optical system 12.

As the order of arranging the mask 7 and the masking blade 11, the masking blade 11 is typically disposed between the illumination optical system 2 and the mask 7. Without being limited to the above, the masking blade 11 may be disposed between the workpiece stage 5 and the mask 7.

If the distance between the masking blade 11 and the mask 7 is too large in the direction of the optical axis O, the boundary between a light-shielding region shielded by the masking blade 11 and an exposure region exposed to the substrate 8 is blurred. Therefore, it is important to sufficiently reduce the distance between the masking blade 11 and the mask 7.

For example, the illumination optical system 2 irradiates the mask 7 with light, and the masking blade 11 disposed in the range of 15 mm with respect to the mask 7 partially blocks the irradiation light. This makes it possible to expose only a necessary region without using the masking blade projection optical system 12.

Assuming that the illumination optical system 2 is located on a positive side and the workpiece stage 5 is located on a negative side with reference to the mask 7, the masking blade 11 is disposed in the range of 15 mm on either the positive side or the negative side. In this case, it can be said that the masking blade 11 is disposed within +15 mm with respect to the mask 7.

Since each of the masking blade 11 and the mask 7 is driven, a certain interval between the masking blade 11 and the mask 7 is required. For example, an appropriate interval between the masking blade 11 and the mask 7 is set so as not to interfere with each other while keeping the masking blade 11 and the mask 7 as close to each other as possible within the range of 15 mm. This makes it possible to expose only a necessary region.

Each configuration of the exposure apparatus, the illumination optical system, each optical component such as the bandpass filter included in the illumination optical system, and the like, and methods such as the irradiation method and the component manufacturing method described with reference to the drawings are merely embodiments, and can be discretionally modified without departing from the gist of the present invention. In other words, any other configurations and methods for carrying out the present invention may be employed.

It should be understood by those skilled in the art that various modifications, combinations, sub-combinations and alterations may occur depending on design requirements and other factors insofar as they are within the scope of the appended claims or the equivalents thereof.

What is claimed is:

1. An illumination optical system that irradiates a target object with light from a light source unit, comprising:
    an integrator optical system that is disposed on an optical path of the light emitted from the light source unit and uniformizes an illuminance distribution of the light with which the target object is to be irradiated;
    a condenser lens that includes a plurality of lenses and irradiates the target object with the light emitted from the integrator optical system; and
    a bandpass filter that is disposed between any two of the plurality of lenses included in the condenser lens.

2. The illumination optical system according to claim 1, further comprising:
    a beam splitter that is disposed on an optical path from the integrator optical system to the condenser lens and splits the light emitted from the integrator optical system into first split light and second split light, the first split light traveling toward the condenser lens along the optical path, the second split light traveling in a direction deviated from the optical path; and
    a sensor unit that is disposed at a position on which the second split light is to be incident, and detects a state of the light.

3. The illumination optical system according to claim 2, further comprising
    a second bandpass filter that is disposed on a light-incident side of the sensor unit when the bandpass filter is used as a first bandpass filter, the second bandpass filter having a filter characteristic identical to a filter characteristic of the first bandpass filter.

4. The illumination optical system according to claim 3, wherein
    the bandpass filter has a half bandwidth of 10 nm or less.

5. The illumination optical system according to claim 2, wherein
    the bandpass filter has a half bandwidth of 10 nm or less.

6. The illumination optical system according to claim 1, wherein
    the bandpass filter has a half bandwidth of 10 nm or less.

7. An exposure apparatus, comprising
    the illumination optical system according to claim 1, wherein
    the illumination optical system is configured to irradiate an exposure mask with light.

8. The exposure apparatus according to claim 7, further comprising
    a masking blade that is disposed within a range of 15 mm with respect to the exposure mask, wherein
    the exposure apparatus is configured such that the light for irradiation is partially blocked by the masking blade.

9. The exposure apparatus according to claim 8, further comprising
    a projection optical system that projects a pattern of the exposure mask irradiated with the light onto an exposure target object.

10. The exposure apparatus according to claim 7, further comprising
    a projection optical system that projects a pattern of the exposure mask irradiated with the light onto an exposure target object.

11. An exposure apparatus, comprising:
    the illumination optical system according to claim 1;
    a masking blade; and
    a masking blade projection optical system that projects the light emitted through an aperture of the masking blade onto an exposure mask, wherein
    the illumination optical system is configured to irradiate the aperture of the masking blade with the light.

12. The exposure apparatus according to claim 11, further comprising
    a projection optical system that projects a pattern of the exposure mask irradiated with the light onto an exposure target object.

13. A component manufacturing method, comprising
    performing light irradiation by using an apparatus including the illumination optical system according to claim 1.

14. The component manufacturing method according to claim 13, wherein
    the apparatus including the illumination optical system is an exposure apparatus, and
    the performing light irradiation includes projecting a pattern of an exposure mask.

15. An irradiation method of irradiating a target object with light, comprising:
    emitting light from a light source unit;
    emitting, by an integrator optical system disposed on an optical path of the light emitted from the light source unit, the light toward a condenser lens including a plurality of lenses, in a manner that an illuminance distribution of the light with which the target object is to be irradiated is uniformized; and
    irradiating, by the condenser lens, the target object with light passing through a bandpass filter disposed between any two of the plurality of lenses.

* * * * *